United States Patent

Young et al.

Patent Number: 6,153,254
Date of Patent: Nov. 28, 2000

[54] METHOD AND DEVICE FOR MANUFACTURING AN ELECTROLUMINESCENT DISPLAY SCREEN

[75] Inventors: Edward W. A. Young; Pieter Van Pelt, both of Eindhoven, Netherlands

[73] Assignee: U.S. Philips Corporation, New York, N.Y.

[21] Appl. No.: 09/248,139

[22] Filed: Feb. 10, 1999

[30] Foreign Application Priority Data

Sep. 30, 1998 [EP] European Pat. Off. ............. 98203291

[51] Int. Cl.[7] ................................ B05D 5/12; B05D 1/32
[52] U.S. Cl. ............................. 427/66; 427/282; 156/230
[58] Field of Search ................................ 427/66, 68, 96, 427/282; 156/230; 313/504

[56] References Cited

U.S. PATENT DOCUMENTS

| | | | |
|---|---|---|---|
| 4,127,436 | 11/1978 | Friel | 430/315 |
| 4,159,443 | 6/1979 | Stocker et al. | 315/169.3 |
| 5,049,980 | 9/1991 | Saito et al. | 257/758 |
| 5,466,325 | 11/1995 | Mizuno et al. | 156/344 |
| 5,486,857 | 1/1996 | Smith et al. | 347/224 |
| 5,747,098 | 5/1998 | Larson | 427/58 |
| 5,952,778 | 9/1999 | Haskal et al. | 313/504 |

FOREIGN PATENT DOCUMENTS

0732868A1  9/1996  European Pat. Off. .

*Primary Examiner*—Shrive Beck
*Assistant Examiner*—Michael Cleveland
*Attorney, Agent, or Firm*—John C. Fox; Norman N. Spain

[57] ABSTRACT

A method and a device for manufacturing an electroluminescent display, by means of which a first pattern of electrodes (2) is provided on a flat surface (1) on which a layer of organic electroluminescent material (7) is subsequently deposited. A mask (10) with strips of mask material (11) is formed on a separate support (14), the strips being separated from each other by spaces (12) which correspond to a second pattern of electrodes (8). Subsequently, said mask is transferred to the layer of electroluminescent material in a dry manner by pressing the support onto the substrate. After transferring the mask (10), a second electrode material (13) is deposited, the electrodes of the second pattern being formed in the spaces in the mask. The layer of electroluminescent material (7) may be deposited by vapor deposition, spin-coating or screen-printing.

7 Claims, 6 Drawing Sheets

METHOD AND DEVICE FOR MANUFACTURING AN ELECTROLUMINESCENT DISPLAY SCREEN

BACKGROUND OF THE INVENTION

The invention relates to a method of manufacturing an electroluminescent display screen, in which a first layer of an electrode material is deposited on a flat substrate, in which layer a first pattern of electrodes is formed, whereafter said first pattern is provided with an organic electroluminescent material and a second pattern of electrodes, using a mask with strips of a masking material, which strips are separated from each other by spaces corresponding to the second pattern, in which spaces the electrodes of the second pattern are formed by deposition of a second electrode material. The invention also relates to a device for carrying out this method.

At the location where electrode patterns cross each other, pixels are formed which emit light if a suitable electric voltage is applied to such an electrode crossing. The display screen may include very many pixels. The pixels may be, for example, segments of digits, letters and other characters to be displayed. The pixels may also form a matrix. Segmented screens are designed for a specific application, for example as a screen for a digital clock. Matrix screens find a much wider application, and can be used, for example, for displaying TV images. However, driving matrix screens is more complex than driving segmented screens.

Customarily, the substrate and the first electrode pattern are transparent, so that the light can egress on the substrate side of the display screen. On the substrate, a single display screen may be formed, such as a screen for displaying TV images, but also a number of display screens, such as the much smaller, segmented display screens used in digital clocks.

Organic electroluminescent materials are permeable to water. After deposition of the electroluminescent material, the subsequent process steps must be carried out in a dry manner. If not, water can penetrate as far as the boundary between the second electrode material and the electroluminescent material. As a result, the injection of charge carriers into the electroluminescent material is hampered and hence a satisfactory operation of the display screen prevented. As a result, customary photolithographic processes cannot be applied.

EP-A-732868 discloses a method of the type mentioned in the opening paragraph, in which, after the first electrode pattern has been formed, the mask is formed thereon in a customary manner by means of photolithography. The assembly is dried, whereafter a layer of an organic electroluminescent material and the second layer of electrode material are successively vapour-deposited on the strips of masking material and in the spaces between these strips. The strips of masking material are so high that a second pattern of separated electrodes is formed. The strips of masking material form part of the display screen and serve as an electrical insulation between the electrodes.

To fill the spaces between the strips of masking material with the organic electroluminescent material, said material is provided by vapor deposition. Vapor deposition is a process which can suitably be used to fill the spaces; simpler and cheaper techniques, such as spin-coating and screen-printing cannot be used. If, in the known method, the layer of electroluminescent material is deposited by a process other than vapor deposition, it cannot be guaranteed that the layer has a uniform thickness in all spaces. As a result, in operation, the pixels will not all emit the same amount of light. Due to the limited deposition possibilities, the number of organic electroluminescent materials which can suitably be used in the known method is limited.

SUMMARY OF THE INVENTION

It is an object of the invention to provide a method which is more flexible as regards the manner of depositing the layer of organic electroluminescent material, so that a larger group of organic electroluminescent materials can suitably be used to manufacture an electroluminescent display screen.

To achieve this, the method mentioned in the opening paragraph is characterized in that a layer of an organic electroluminescent material is deposited on and between the electrodes of the first pattern of electrodes, and that the mask is formed on a separate support and subsequently transferred, in a dry manner, to the layer of electroluminescent material, whereafter the second layer of electrode material is deposited in the spaces of the mask.

The layer of electroluminescent material is deposited on and between the electrodes of the first pattern of electrodes, whereafter the mask is provided on this layer. In this case, a layer having a sufficiently homogeneous thickness can be obtained by vapor-deposition as well as spin-coating and (screen)printing. Since both deposition techniques can be employed, also more materials can suitably be used in the method in accordance with the invention. The mask, which is formed on the separate support, can be customarily manufactured by means of photolithography.

The mask may be provided, for example, on a glass support, which support is subsequently pressed with its mask side onto the substrate. In this process, it is difficult to preclude air inclusions. Preferably, a flexible foil is used as the support for the mask, and when the mask is transferred, the foil is pressed with its mask side against the layer of electroluminescent material by means of a underpressure between the foil and the substrate. The mask can then be transferred without air inclusions to the layer of electroluminescent material.

A proper transfer of the mask to the layer of electroluminescent material is obtained if the mask is formed by exposing a layer of a photoresist, which is provided on the flexible foil, in accordance with the pattern of the mask and subsequently developing the photoresist. It has been found that, after exerting pressure, the photoresist bonds better to the layer of electroluminescent material than to the flexible foil, in particular if during transferring the mask to the layer of electroluminescent material the substrate is heated, whereafter the substrate is cooled and the foil pulled off.

Like in the known method, the mask may remain on the display screen. Preferably, however, after deposition of the second electrode material, the strips of the mask and the second electrode material deposited thereon are removed. It is thus precluded that the electrode material present on the mask strips can cause a short-circuit between adjacent electrodes. In addition, the mask can be used to cover places on the substrate where the second electrode material should not be deposited. Connection contacts for the first and the second pattern of electrodes can then be covered as well as the spaces between different display screens formed on the same substrate.

The strips of the mask and the electrode material deposited thereon can be readily removed by pressing a sticky, flexible foil onto said strips and, subsequently, pulling off the foil. Preferably, the flexible, sticky foil is pressed onto strips of the mask by means of an underpressure between the foil and the substrate. As a result, the foil is pressed onto the substrate without air inclusions. It could be attributed to air inclusions that not all mask strips are removed from the substrate.

The invention also relates to a device for pressing a flexible foil onto a surface of a flat substrate. This device is provided with a substrate holder having a chamber with a flat bottom onto which the substrate can be fixed, said chamber being surrounded by an edge having a surface which extends parallel to the bottom of the chamber over which a flat ring can be moved and onto which the foil can be fixed, said substrate holder further comprising channels enabling an underpressure to be created between the foil and the substrate.

The device can be used for transferring the mask and for removing the mask strips after the deposition of the second layer of electrode material. The ring onto which the foil with the mask is fixed, can be moved relative to the substrate. As a result, the mask can be accurately aligned relative to the first pattern of electrodes.

To make the above-mentioned heating and cooling of the substrate easy, the substrate holder is provided with a heating element and a cooling system.

These and other aspects of the invention will be apparent from elucidated with reference to the embodiments described hereinafter.

BRIEF DESCRIPTION OF THE DRAWING

In the drawings:

FIG. 2 is a diagrammatic, cross-sectional view of the display screen shown in FIG. 1, the sectional view shown in FIG. 2A being taken on the line A—A in FIG. 1, and the sectional view shown in FIG. 2B being taken on the line B—B.

DESCRIPTION OF THE PREFERRED EMBODIMENTS

Figure 1:
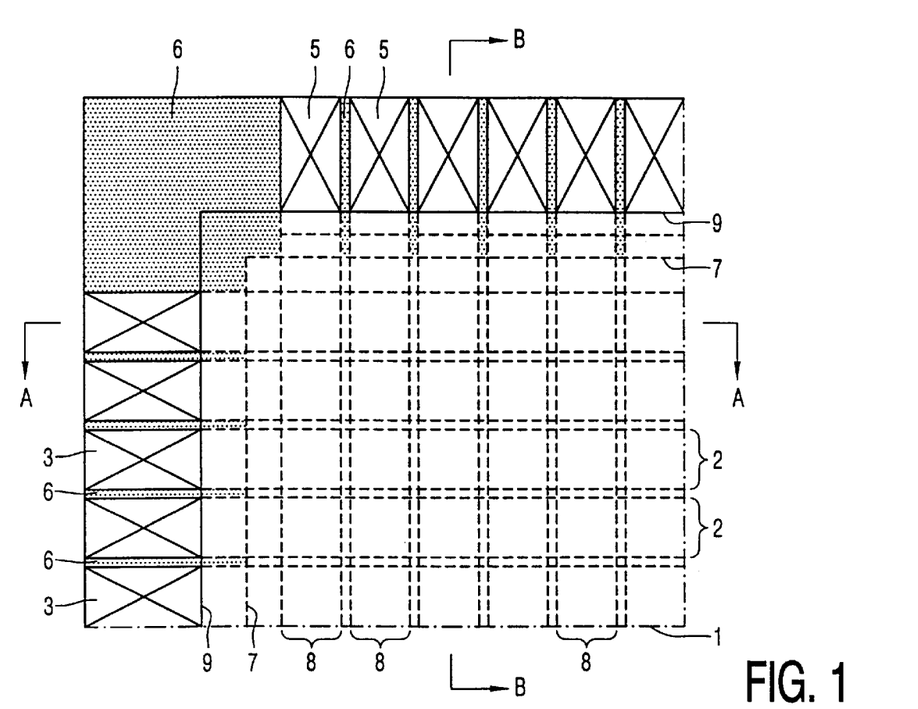
FIG. 1 is a diagrammatic, plan view of an electroluminescent display screen manufactured by means of the method in accordance with the invention.
Figure 2A:
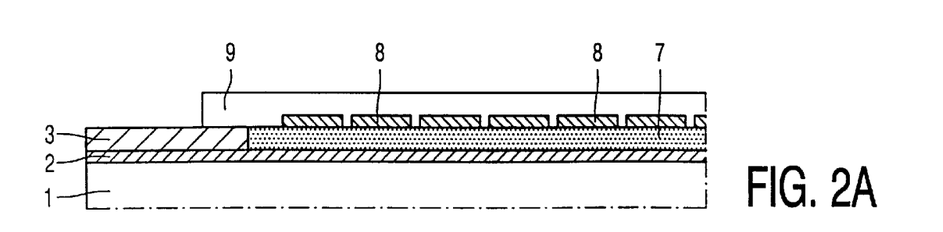
Figure 2B:
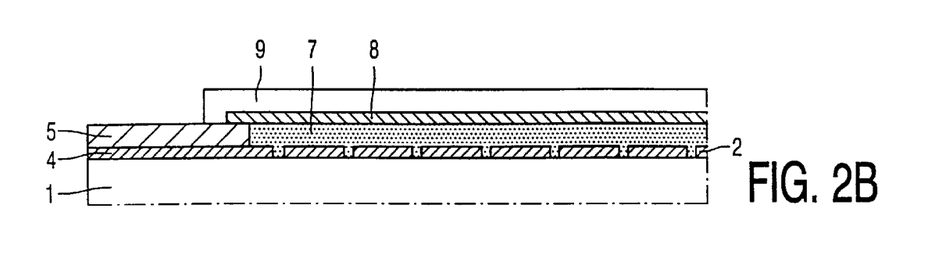
Figure 3A:
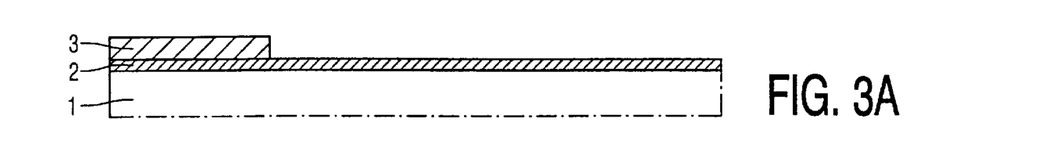
FIGS. 3A, 3B, 4A, 4B, 5A, 5B, 6A, 6B, 7A, 7B, 8A, 8B, 9A, 9B, 10A, and 10B are diagrammatic, cross-sectional views of several stages in the manufacture of the display screen shown in FIG. 1, the sectional view taken on, the line A—A in FIG. 1 being shown in the Figures with index A, and the sectional views taken on the line B—B being shown in the Figures with index B.
Figure 3B:
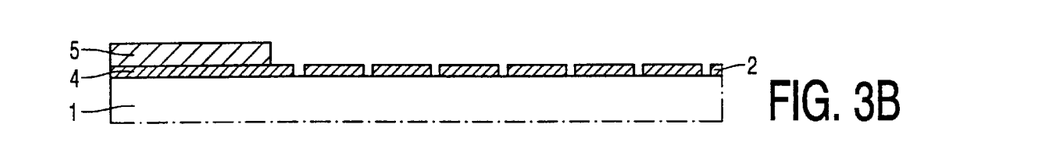

The FIGS. 1, 2A and 2B show diagrammatically, and not to scale, an electroluminescent display screen comprising a flat substrate 1, in this example an approximately 1 mm thick glass plate, on which a first pattern of electrodes 2 is formed. In the example, this first pattern of conductors 2 is formed by means of a customary photolithographic process in an approximately 120 nm thick layer of indium tin oxide (ITO), which is deposited on the substrate 1 in a customary manner. The electrodes 2 are provided with contacts 3 at the edge of the substrate. Conductors 4 provided with contacts 5 are also formed in the ITO layer. The contacts 3 and 5 consist, in this example, of an approximately 100 nm thick underlayer of chromium and an approximately 900 nm thick top layer of aluminium. The contacts 3 and 5 are insulated from each other by means of an insulating material 6.

An electroluminescent material 7 is provided on the first pattern of electrodes 2, and a second pattern of conductors 8 is formed thereon. The electrodes 8 are connected to the contacts 5. The assembly is covered with a layer of an insulating material A, in this example silicon nitride.

Connection wires can be secured to the contacts 3 and 5 by means of customary bonding techniques, so that electric voltages can be applied to the electrodes. At the location where the electrodes 2 and 8 cross each other, pixels are formed which emit light if a suitable electric voltage is applied to such a crossing of electrodes. In this example, the substrate 1 and the first pattern of electrodes 2 are transparent, so that the light can egress on the substrate side of the display screen. In the Figures, a matrix screen is shown comprising a large number of rows and columns of electrodes 2 and 8. The pixels may alternatively be segments of digits, letters and other characters to be displayed.

In this example, a single display screen is formed on the substrate, however, it is alternatively possible to form a number of segmented or matrix display screens on the substrate. After the manufacture, the substrate is divided into individual display screens. In the manufacture of segmented display screens, a layer of an insulating material is often additionally provided between the first pattern of electrodes and the layer of electroluminescent material. A pattern corresponding to the segments is then etched in the layer of insulating material.

FIGS. 3A, 3B, 4A, 4B, 5A, 5B, 6A, 6B, 7A, 7B, 8A, 8B, 9A, 9B, 10A, and 10B show stages in the manufacture of a display screen by means of the method in accordance with the invention (the Figures with index A are sectional views taken on the line A—A in FIG. 1, the Figures with index B are sectional views taken on the line B—B). FIG. 1 shows the substrate 1 on which the first pattern of electrodes 2 provided with the contacts 3 as well as the conductors 4 provided with the contacts 5 are formed. The contacts 3 and 5 are insulated from each other by the insulating layer 6 shown in FIG. 1.

Figure 4A:
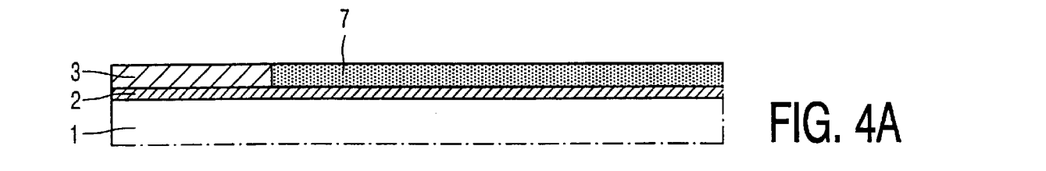
Figure 4B:
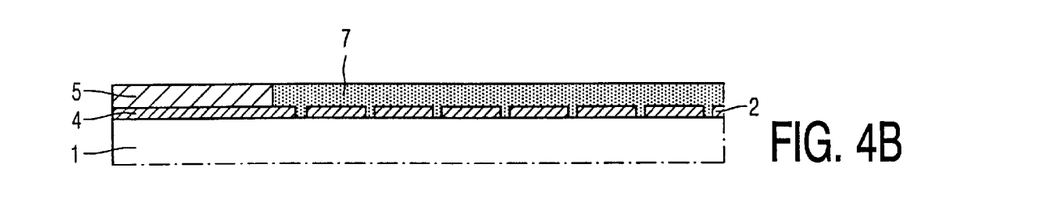

A layer of an electroluminescent material 7 is deposited on and between the electrodes 2 of the first electrode pattern. In this example, this layer consists of an approximately 100 nm thick underlayer of polyethylene dioxythiophene (PDOT) and an approximately 100 nm thick top layer of polydialkoxy-p-phenylene vinylene (PPV). Before depositing the layer of PPV, the layer of PDOT is cured by heating to a temperature of approximately 100° C. Subsequently, organic material is removed from the contacts 3 and 5 by means of laser ablation. The layer of organic material 7 has a flat surface and is of substantially uniform thickness on all electrodes 2.

In this example, the layer of organic electroluminescent material is deposited by means of a customary spin-coating process. Such a process enables said layers to be deposited in a simple and cheap manner. By means of customary vapor-deposition processes, organic luminescent layers can be provided which cannot be readily deposited by means of a spin-coating process. Such layers consist, for example, of aluminium oxychelate ($Alq_3$). To produce a display screen which is suitable for displaying colors, the layer 7 may alternatively be built up of electroluminescent materials emitting different colors. These materials may be provided, for example, by means of (screen) printing. The method in accordance with the invention is flexible as regards the way in which the layer of organic electroluminescent material is deposited, so that a large group of organic electroluminescent materials can suitably be used to manufacture an electroluminescent display screen.

The organic layer 7 is water-permeable. After deposition of this layer, subsequent process steps must be carried out in a dry manner. If not, water can penetrate to where the second electrode material and the electroluminescent material border on each other. As a result, injection of charge carriers into the electroluminescent material is hampered and hence a proper operation of the display screen prevented. Consequently, customary photolithographic processes cannot be applied.

Figure 7A:
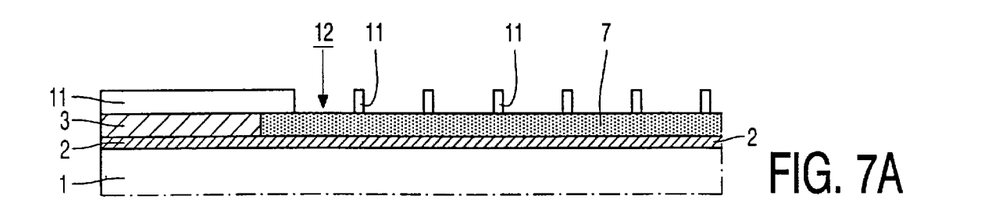
Figure 7B:
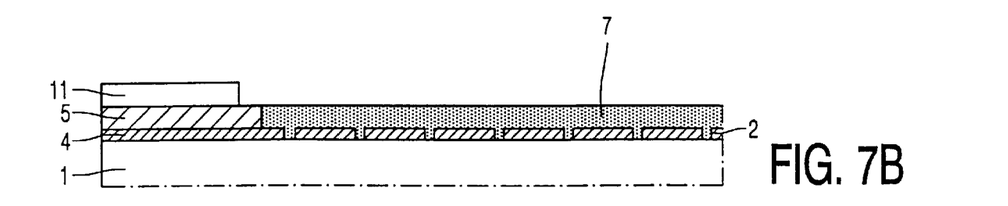

In the next process steps, use is made, as shown in FIGS. 7A and 7B, of a mask with strips of mask material 11 which are separated from each other by spaces 12 which correspond the second pattern of electrodes 8. The electrodes 8 are subsequently formed, as shown in FIGS. 8A and 8B, by deposition of a second electrode material 13.

Figure 5A:
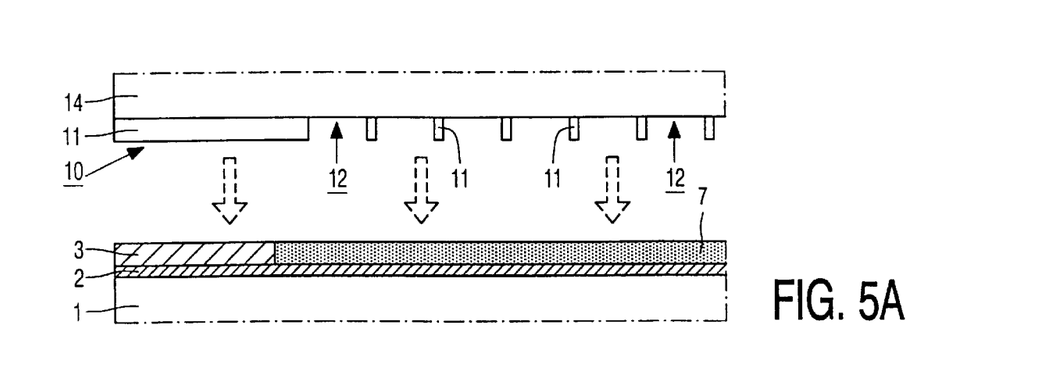
Figure 5B:
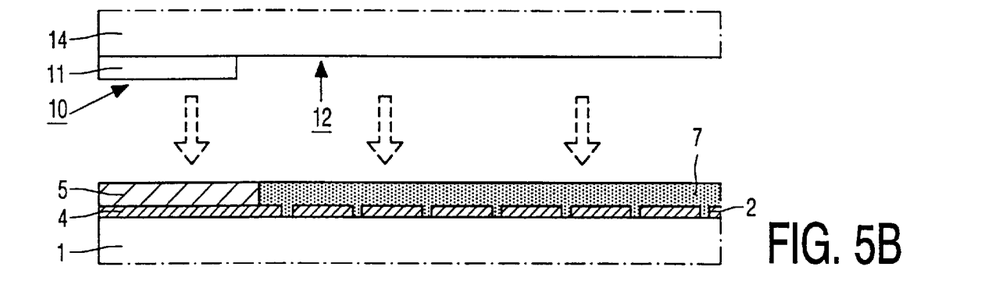
Figure 6A:
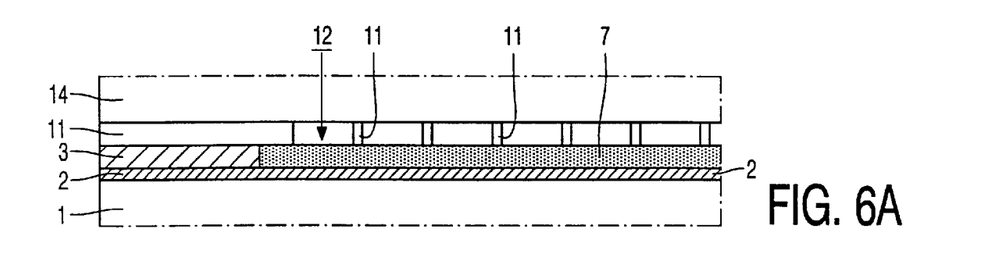
Figure 6B:
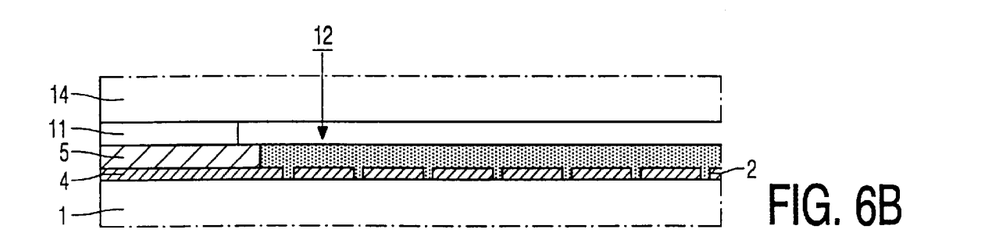
Figure 8A:
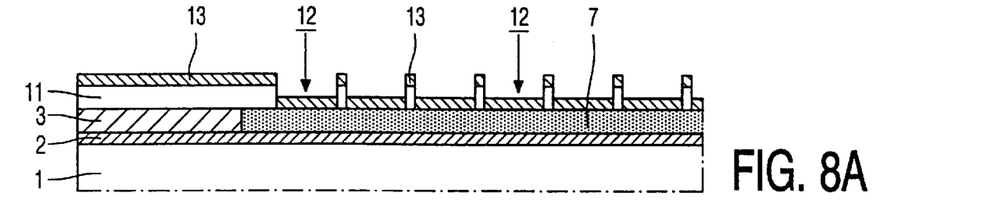
Figure 8B:
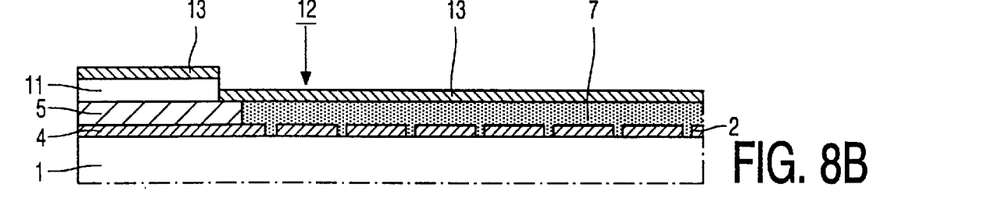

As shown in the FIGS. 5, the mask 10 is formed on a separate support 14 and subsequently, as shown in FIGS. 6 and 7, transferred in a dry manner to the layer of electroluminescent material 7, whereafter, as shown in FIGS. 8, the second layer of electrode material 13 is deposited on the strips 11 and in the spaces 12 of the mask. In this manner, the second pattern of electrodes 8 is formed. The second layer of electrode material consists of an approximately 30 nm thick underlayer of barium with an approximately 500 nm thick layer of aluminium. The barium layer serves to inject electrons into the electroluminescent material, the aluminium layer serves to ensure that the electrodes 8 exhibit a low electric resistance.

For the support 14 use is preferably made of a flexible foil. When the mask 10 is transferred to the substrate 1, as shown in the FIGS. 6 and 7, the foil 14 is pressed with its mask side onto the layer of electroluminescent material 7 by means of an underpressure between the foil and the substrate. In this manner, the mask 10 can be transferred without air inclusions to the layer of electroluminescent material 7.

Preferably, use is made of a foil provided with a layer of a photoresist, such as the commercially available Laminar 5032 by Morton or Aqua Mer SF by Hercules, which are used to provide layers of a photoresist onto printed circuit boards. The photoresist applied to the printed circuit boards is subsequently exposed and developed. The mask 10 is formed in the layer of photoresist on the foil by exposing this layer in accordance with the pattern of the mask and subsequently developing the photoresist. After exerting pressure, the photoresist exhibits a better adhesion to the layer of electroluminescent material than to the flexible foil, in particular if the substrate is heated when the mask is being transferred to the layer of electroluminescent material, whereafter the substrate is cooled and the foil pulled away.

After the deposition of the second electrode material 13, the strips 11 of the mask 10 and the second electrode material 13 deposited thereon are removed. It is thus prevented that the electrode material 13 situated on the mask strips can cause short-circuits between adjacent electrodes 8.

Figure 9A:
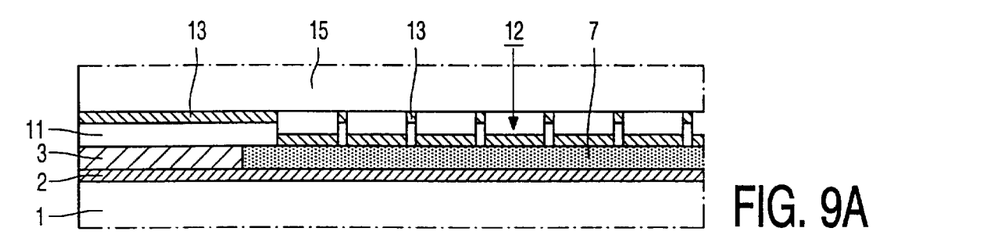
Figure 9B:
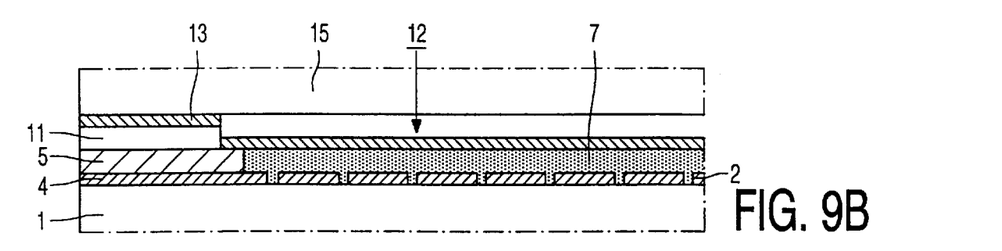
Figure 10A:
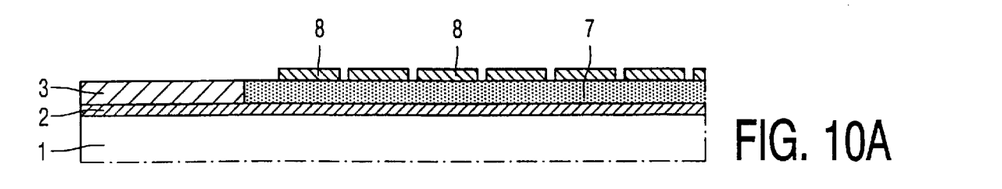
Figure 10B:
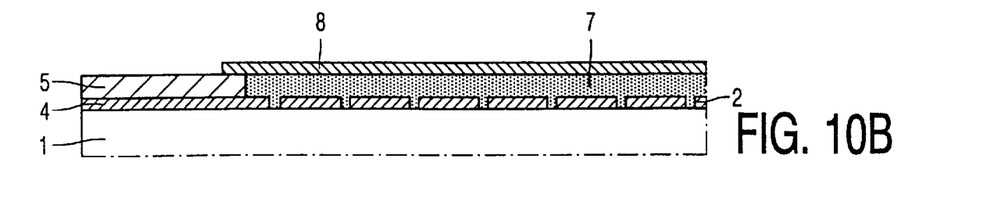

The strips 11 of the mask 10 with the electrode material 13 deposited thereon are removed, as shown in FIGS. 9 and 10, by pressing a sticky flexible foil 15 onto said strips and subsequently pulling away the foil 15. Preferably, the flexible, sticky foil is pressed onto the strips 11 of the mask by means of an underpressure between the foil 15 and the substrate 1. As a result, the foil is pressed onto the substrate without air inclusions. It could be attributed to air inclusions that not all mask strips 11 are removed from the substrate. It has been found that the second electrode material 13 adheres so well to the photoresist of the strips 11, that this photoresist removes the mask strips 11 with the electrode material 13 by means of the sticky foil 15. Suitable foils are those which are used as sticky-mats in clean rooms, such as the foil SWT-10 by Nitto Denko.

The mask 10 can also be used to cover areas on the substrate where the second electrode material must not be deposited. As shown in FIGS. 6 through 9, the connection contacts 3 and 5 for the first pattern 2 and the second pattern 8 of electrodes are covered with mask tracks 11. Said mask tracks and the electrode material 13 present thereon are removed, so that the display screen can be connected via the connection contacts 3 and 5. It is also possible to provide mask strips in the spaces between different display screens formed on the same substrate, so that also in this case no electrode material remains after the removal of the mask.

FIGS. 11, 12, 13, 14, 15, and 16 show a device for manufacturing the display screen in accordance with the invention. This device can be used to provide the mask 10 on the substrate 1 as well as to remove the mask from said substrate.

Figure 11:
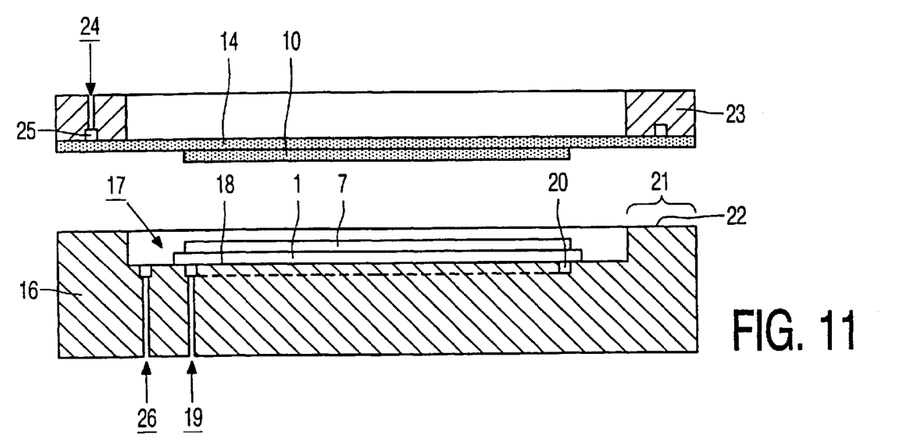
FIGS. 11, 12, 13, 14, 15, and 16 show a device for the manufacture of the display screen in accordance with the invention.

The Figures show a device comprising a substrate holder 16 with a chamber 17 having a flat bottom 18 on which the substrate 1 can be fixed. FIG. 11 shows the substrate 1 provided with the layer of electroluminescent material 7. The substrate 1 is fixed in the chamber 17 by means of an underpressure which can be created between the substrate 1 and the bottom 18 by means of a pump, which is not shown, and via the channel 19 and the groove 20 formed in the bottom 18.

The chamber 17 is surrounded by an edge 21 having a surface 22 which extends parallel to the bottom 18 of the chamber 17. A flat ring 23 can be slidably arranged on the edge 21. The foil 14 can be secured on this ring; in FIG. 11, the foil 14 with the mask 10 formed thereon are fixed to this ring (as shown in FIG. 5). The foil 14 is fixed to the ring 23 by means of an underpressure which can be created between the foil 14 and the ring 23 by means of a pump, not shown, and via the channel 24 and the groove 25 formed in the ring 23.

Figure 12:
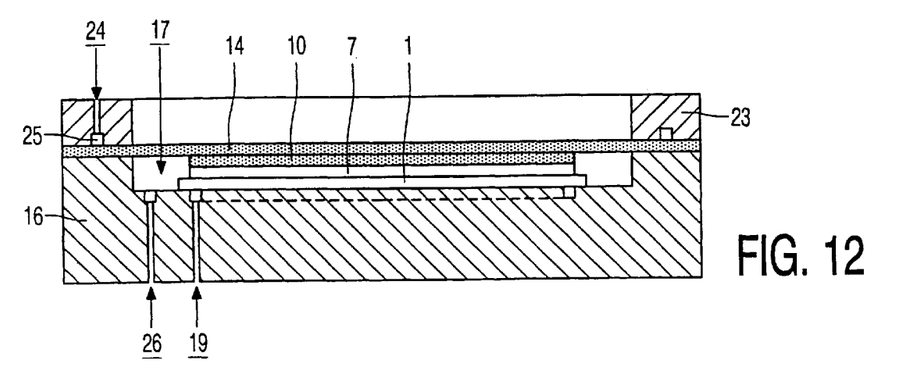

FIG. 12 shows the stage in the manufacture shown in FIGS. 6, in which the foil 14 with the mask 10 is pressed onto the substrate 1. The ring 23 with the foil 14 is arranged on the surface 22 of the edge 21, and by means of an underpressure generated in the chamber 17 via the channel 26, the foil 14 is pressed onto the layer 7 on the substrate 1. In this process, there are no air inclusions. The ring 23 on which the foil 14 with the mask 10 is fixed, is slidable relative to the substrate 1. As a result, the mask 10 can be accurately aligned relative to the first pattern of electrodes 2.

The substrate holder is provided with a heating element, not shown, in the form of resistance wires through which an electric current can be sent. During pressing the foil 14 onto the substrate 1, the substrate holder is heated to a temperature of approximately 45° C.

Figure 13:
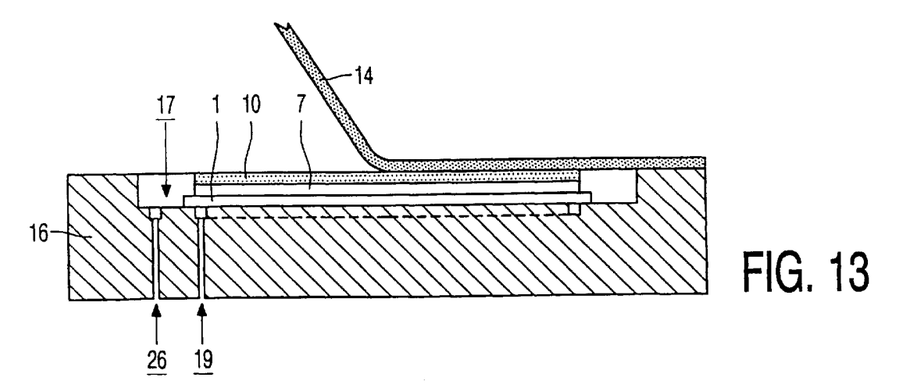

FIG. 13 shows the device from which the ring 23 has been removed. The substrate holder is cooled by means of a cooling system, not shown, which is composed of several channels formed in the holder 16, through which channels a cooling liquid can be passed. The foil 14 can now be readily removed from the substrate, while the substrate is retained in the chamber 17. As shown in FIGS. 7, the mask 10 remains on the layer of electroluminescent material 7.

Apart from transferring the mask 10 to the substrate 1, the device can also be used to remove the mask strips 11 after the deposition of the second layer of electrode material 13, as shown in FIGS. 9.

Figure 14:
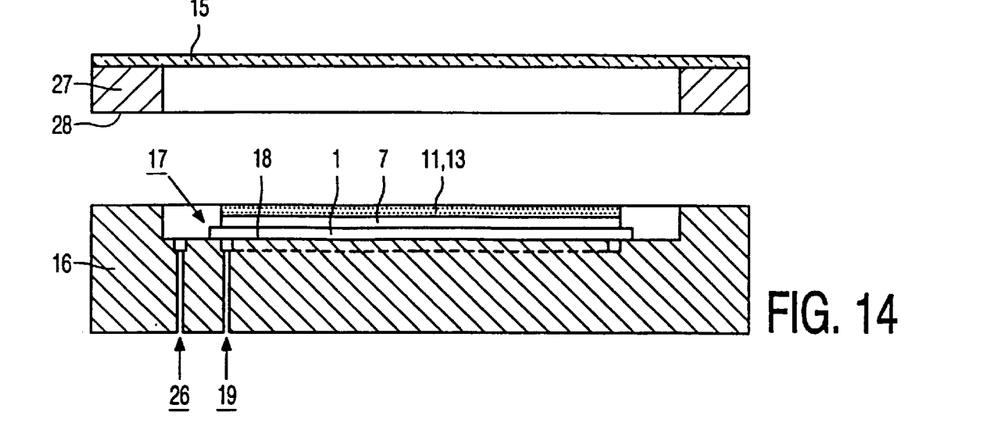
Figure 15:
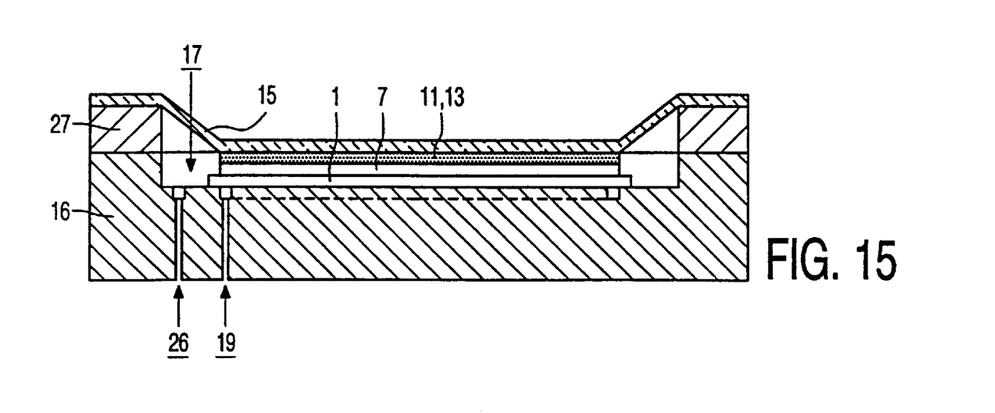
Figure 16:
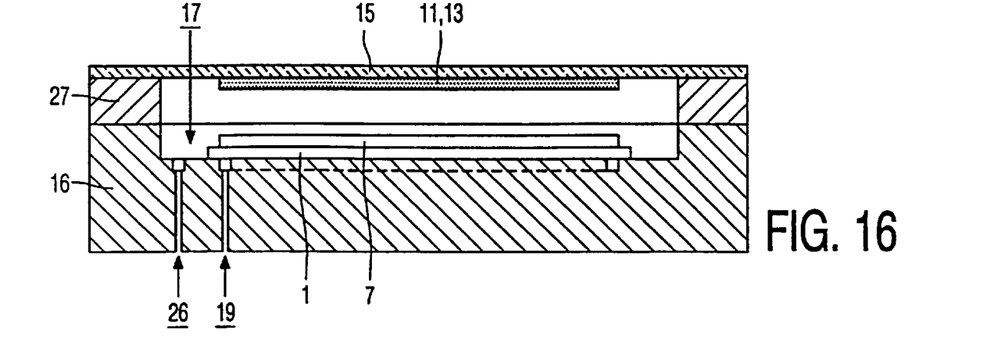

FIG. 14 shows the substrate holder comprising the substrate 1 with the electroluminescent layer 7 and, present thereon, the mask strips 11 with the electrode material 13. The sticky foil is provided on the ring 27, which is provided with a surface 28 which accurately fits on the surface 22 of the edge 21 of the substrate holder 17. After the ring 27 is arranged on the substrate holder, as shown in FIG. 15, the foil 15 is pressed against the substrate 1 by means of an underpressure which is created, via the channel 26, in the chamber 17. Subsequently, via the channel 26, air is allowed to enter the room 17, so that the foil 15, as shown in FIG. 16, is pulled off the substrate again. In this process, the mask strips 11 with the electrode material 13 present thereon are also removed.

What is claimed is:

1. A method of manufacturing an electroluminescent display screen, comprising the steps of:

forming a first layer of an electrode material on a flat substrate;

forming the first layer of electrode material into a first pattern of electrodes;

depositing an organic electroluminescent layer on the first pattern of electrodes;

forming a patterned mask on a separate support, said mask comprising strips separated from each other by spaces;

transferring the patterned mask onto the organic electroluminescent layer in a dry process, in a manner such that the mask leaves portions of the organic electroluminescent layer exposed;

and subsequently depositing a second electrode material on the mask and the exposed portions of the organic electroluminescent layer.

2. A method as claimed in claim 1, characterized in that a flexible foil is used as the support for the mask, and when the mask is transferred, the foil is pressed with its mask side against the layer of electroluminescent material by means of an underpressure between the foil and the substrate.

3. A method as claimed in claim 2, characterized in that the mask is formed by exposing a layer of a photoresist, which is provided on the flexible foil, in accordance with the pattern of the mask and subsequently developing the photoresist.

4. A method as claimed in claim 3, characterized in that the substrate is heated when the mask is transferred to the layer of electroluminescent material, whereafter the substrate is cooled and the foil pulled off.

5. A method as claimed in claim 1, characterized in that after deposition of the second electrode material, the strips of the mask and the second electrode material deposited thereon are removed.

6. A method as claimed in claim 5, characterized in that the strips of the mask and the electrode material deposited thereon are removed by pressing a sticky, flexible foil onto said strips and, subsequently, pulling off the foil.

7. A method as claimed in claim 6, characterized in that the flexible, sticky foil is pressed onto strips of the mask by means of an underpressure between the foil and the substrate.

* * * * *